(12) United States Patent
Badawy et al.

(10) Patent No.: US 11,867,735 B2
(45) Date of Patent: Jan. 9, 2024

(54) METHOD AND APPARATUS FOR DIGITAL VSWR MEASUREMENT IN ADVANCED ANTENNA SYSTEMS (AAS)

(71) Applicant: Telefonaktiebolaget LM Ericsson (publ), Stockholm (SE)

(72) Inventors: Ahmed Badawy, Kanata (CA); Marthinus Willem Da Silveira, Ottawa (CA); Harry Hang Zhu, Ottawa (CA)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 449 days.

(21) Appl. No.: 17/283,610

(22) PCT Filed: Oct. 15, 2018

(86) PCT No.: PCT/IB2018/057986
§ 371 (c)(1),
(2) Date: Apr. 8, 2021

(87) PCT Pub. No.: WO2020/079467
PCT Pub. Date: Apr. 23, 2020

(65) Prior Publication Data
US 2021/0389357 A1    Dec. 16, 2021

(51) Int. Cl.
*G01R 27/06* (2006.01)
*H04B 17/10* (2015.01)
*H01Q 25/00* (2006.01)

(52) U.S. Cl.
CPC ............ *G01R 27/06* (2013.01); *H04B 17/102* (2015.01); *H04B 17/103* (2015.01); *H01Q 25/001* (2013.01)

(58) Field of Classification Search
CPC .. H04B 17/102; H04B 17/103; H04B 17/101; H04B 17/0085; H04B 17/12;
(Continued)

(56) References Cited

U.S. PATENT DOCUMENTS 11,297,567 B2 *  4/2022  Li ................... H04W 52/0225
11,489,593 B2 * 11/2022  Chang .................. H04B 1/0096

FOREIGN PATENT DOCUMENTS

CN    103646144 A    3/2014
WO    2017/081522 A1    5/2017

OTHER PUBLICATIONS

International Search Report and Written Opinion dated Jun. 19, 2019 issued in PCT Application No. PCT/IB2018/057986, consisting of 12 pages.

* cited by examiner

Primary Examiner — Monica C King
(74) Attorney, Agent, or Firm — Sage Patent Group

(57) ABSTRACT

A method and transmitter for determining voltage standing wave ratios, VSWR, of an antenna array having multiple subarrays, each subarray having two branches. According to one aspect, a method includes grouping the branches of the 5 antenna array to form a number of groups, each group being formed so that nearest branches in group are separated by at least one branch not in the group. For each group, the method includes combining reflected signals from the branches of the group to produce a first signal YREFL and combining forward signals from the 10 branches of the group to produce a second signal YFWD; calculating a reflected power PREFL and a forward power PFWD and calculating a VSWR for the group based on the reflected power PREFL and the forward power PFWD.

23 Claims, 8 Drawing Sheets

(58) Field of Classification Search
CPC .......... H04B 17/14; H04B 17/21; H04B 7/04; G01R 27/06; H01Q 25/001
See application file for complete search history.

METHOD AND APPARATUS FOR DIGITAL VSWR MEASUREMENT IN ADVANCED ANTENNA SYSTEMS (AAS)

CROSS-REFERENCE TO RELATED APPLICATIONS

This application is a Submission Under 35 U.S.C. § 371 for U.S. National Stage Patent Application of International Application Number: PCT/IB2018/057986, filed Oct. 15, 2018 entitled "METHOD AND APPARATUS FOR DIGITAL VSWR MEASUREMENT IN ADVANCED ANTENNA SYSTEMS (AAS)," the entirety of which is incorporated herein by reference.

TECHNICAL FIELD

This disclosure relates to wireless communication and in particular, voltage standing wave ratio (VSWR) measurement in advanced antenna systems (AAS).

BACKGROUND

Antenna arrays play a role in supporting the increasing demand for high capacity and high throughput communication. Antenna arrays can increase the radiation gain, allow for steering the main beam in a desired direction and place a null towards an interferer. In addition, voltage standing wave ratio (VSWR) is a parameter that is measured by radios to detect antenna failure and/or obstruction within the proximity of the radiating antenna, and to monitor transmission efficiency. Referring to FIG. 1, bi-directional couplers 102 are used to measure forward power through port 3, and reflected power through port 4. By estimating the ratio between the forward signal $V_f$ and reflected signal, $V_r$, the reflection coefficient, Γ, is estimated according to $$\Gamma = \frac{V_r}{V_f} \quad (1)$$

From which VSWR is estimated as $$VSWR = \frac{1+|\Gamma|}{1-|\Gamma|} \quad (2)$$

FIG. 2 depicts an antenna array having M branches that are connected to M bi-directional couplers. Couplers 102a-102M, referred to collectively as couplers 102, and combiners 103a-103M, referred to collectively herein as combiners 103, capture and combine the forward and reflected signals. The forward signals received through the couplers' port 3 are combined. The reflected signals through couplers' port 4 are combined.

Within antenna arrays, antenna elements are placed within close proximity of one another; typically, 0.5λ separation between adjacent elements, where λ is the wavelength. The result of this is strong mutual coupling between antenna elements as depicted in FIG. 2. Signals transmitted from one antenna element branch are coupled over the air to all other antenna branches, then pass through the couplers and are combined.

Antenna arrays used for beamforming have strong mutual coupling between the antenna elements or sub-arrays. The mutual coupling has a severe impact on the performance of VSWR measurements on the combined reflected signal from couplers at the antenna/sub-array inputs. Mutually coupled signals are versions of the transmitted signals, i.e., self-signals, and are almost inseparable from the desired signal through the forward and reflected paths, which are used for VSWR measurements. To this end, mutual coupling will typically have a severe impact on the performance of any VSWR measurement algorithm.

There is a way to separate the reflected signal by putting one switch on each of the antenna branches. However, a typical AAS antenna system is not an active antenna array that does not allow internal switching and external control. Nor is it realistic to add switches inside of the antenna system. Switches could be added inside the radio unit but, since the antenna array size of the fifth generation (5G) (also referred to as "New Radio" (NR)). AAS system is big, e.g., having 32 ports, adding physical connectors between AAS antenna and radio unit for each port is not feasible. Adding these physical connectors would occupy a very large amount of physical space that is not possible to meet tight hardware space requirements of the AAS radio. Therefore, another way is needed to mitigate the impact of mutual coupling on VSWR measurements.

SUMMARY

Some embodiments advantageously provide a method, apparatuses and system for facilitating voltage standing wave ratio (VSWR) measurements in advanced antenna systems (AAS) in the presence of mutual coupling.

To mitigate the impact of mutual coupling on the VSWR measurement method, a new pattern to group the AAS antenna branches together with no adjacent antenna branches having the same polarization direction to reduce the mutual coupling effect within each sub-group of antenna branches is provided. This is accomplished with a small number of connections between antenna system and radio unit to allow a feasible HW implementation of the 5G AAS radio.

Since the received forward signal is a summation of M forward signals and likewise for the received reflected signal, a solution presented herein includes transmitting a set of M orthogonal signals, saving them at a digital signal processing (DSP) unit and cross-correlating the received forward and reflected signals in order to be able to estimate the forward and reflected powers at each antenna element branch.

According to one aspect, a method of determining voltage standing wave ratios, VSWR, of an antenna array having multiple subarrays, each subarray having two branches, each of the two branches having different polarizations so that a subarray is dual-polarized. The method includes grouping the branches of the antenna array to form a number of groups, each group being formed so that nearest branches in a group differ in polarization and so that nearest branches in a row of branches in the group are separated by at least one branch not in the group. The method includes for each group: combining reflected signals from the branches of the group to produce a first signal $Y_{REFL}$ and combining forward signals from the branches of the group to produce a second signal $Y_{FWD}$; calculating a reflected power $P_{REFL}$ from a product of the first signal $Y_{REFL}$ and a matrix X of orthogonal signals corresponding to transmission signals coupled to the branches of the group; calculating a forward power $P_{FWD}$ from a product of the second signal $Y_{FWD}$ and the matrix X; and calculating a VSWR for the group based on the reflected power $P_{REFL}$ and the forward power $P_{FWD}$.

According to this aspect, in some embodiments, nearest branches of a group within a row are separated by one subarray in the row. In some embodiments, the reflected signals are each from a port of a coupler connected to a branch of the group. In some embodiments, a port of each coupler connected to a branch of the group provides a forward signal. In some embodiments, the VSWR is computed based on a ratio of a magnitude of $P_{REFL}$ to a magnitude of $P_{FWD}$. In some embodiments, this ratio of magnitudes represents the reflection coefficient, from which the VSWR is then estimated, for example as shown in equations 1 and 2 above. In some embodiments, a return loss is computed based on a difference between $P_{REFL}$ expressed in dB and $P_{FWD}$ expressed in dB. In some embodiments, the combining is performed by at least one switch in a radio unit connected to the antenna array. In some embodiments, the number of switches is equal to the number of groups minus one. In some embodiments, a group is selectable by at least one switch controllable by a processor of a radio unit connected to the antenna array. In some embodiments, the number of groups is equal to a total number of subarrays of the antenna array divided by a power of two. In some embodiments, the method further includes, for each group, performing delay estimation and compensation for the combined reflected signals and for the combined forward signals.

According to another aspect, a transmitter configured to determine voltage standing wave ratios, VSWR, of an antenna array having multiple subarrays, each subarray having two branches, each of the two branches having different polarizations so that a subarray is dual-polarized is provided. The transmitter includes, for each group of a plurality of branches of the antenna array, a plurality of couplers, each coupler connected to a branch in a group, each group being formed so that nearest branches in a group differ in polarization and so that nearest branches in a row of branches in the group are separated by at least one branch not in the group. The transmitter further includes a first set of combiners configured to combine reflected signals from first ports of the couplers of a group to produce a first signal $Y_{REFL}$. The transmitter further includes a second combiner configured to combine forward signals from second ports of the couplers of the group to produce a second signal $Y_{FWD}$. The transmitter also includes a processor configured to: calculate a reflected power $P_{REFL}$ from a product of the first signal $Y_{REFL}$ and a matrix X of orthogonal signals corresponding to transmission signals coupled to the branches of the group; calculate a forward power $P_{FWD}$ from a product of the second signal $Y_{FWD}$ and the matrix X; and calculate a VSWR for the group based on the reflected power $P_{REFL}$ and the forward power $P_{FWD}$.

According to this aspect, in some embodiments, nearest branches of a group within a row are separated by one subarray in the row. In some embodiments, the reflected signals are each from a port of a coupler connected to a branch of the group. In some embodiments, a port of each coupler connected to a branch of the group provides a forward signal. In some embodiments, the VSWR is computed based on ratio of a magnitude of $P_{REFL}$ to a magnitude of $P_{FWD}$. In some embodiments, a return loss is computed based on a difference between $P_{REFL}$ expressed in dB and $P_{FWD}$ expressed in dB. In some embodiments, the combining is performed by at least one switch in a radio unit connected to the antenna array. In some embodiments, the number of switches is equal to the number of groups minus one. In some embodiments, a group is selectable by at least one switch controllable by a processor of a radio unit connected to the antenna array. In some embodiments, the number of groups is equal to a total number of subarrays of the antenna array divided by a power of two. In some embodiments, the processor is further configured to, for each group, perform delay estimation and compensation for the combined reflected signals and for the combined forward signals.

According to yet another aspect, a method of determining voltage standing wave ratios, VSWR, of an antenna array having a plurality of single-polarized subarrays is provided. The method includes forming a plurality of groups of subarrays, each group being formed so that nearest subarrays in the group are separated by at least one subarray not in the group. For each group, the method includes combining reflected signals from the subarrays of a group to produce a first signal $Y_{REFL}$; combining forward signals from the subarrays of the group to produce a second signal $Y_{FWD}$; multiplying the first signal $Y_{REFL}$ by a matrix X of orthogonal signals corresponding to transmission signals coupled to the subarrays of the group to produce a reflected power $P_{REFL}$; multiplying the second signal $Y_{FWD}$ by the matrix X to produce a forward power $P_{FWD}$; calculating a VSWR for the group based on the reflected power $P_{REFL}$ and the forward power $P_{FWD}$.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
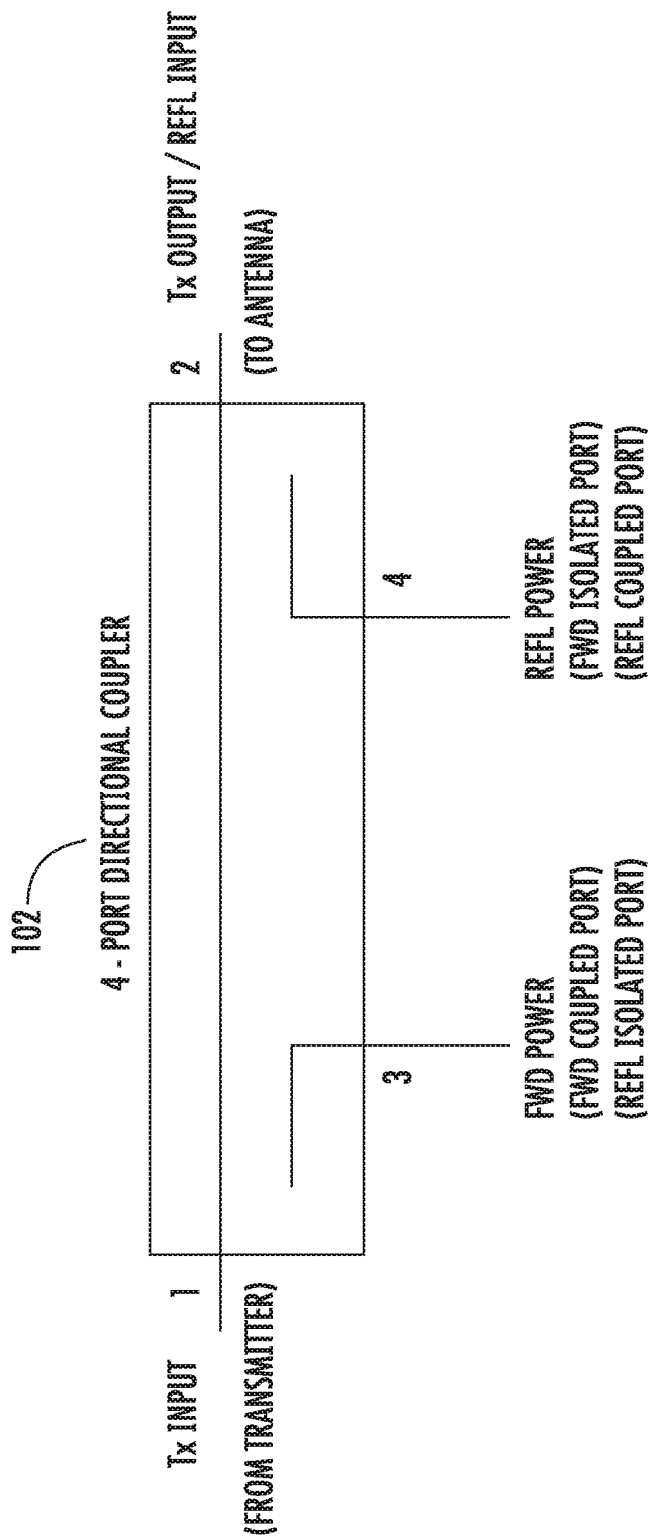
FIG. 1 is a diagram of a four port directional coupler.
Figure 2:
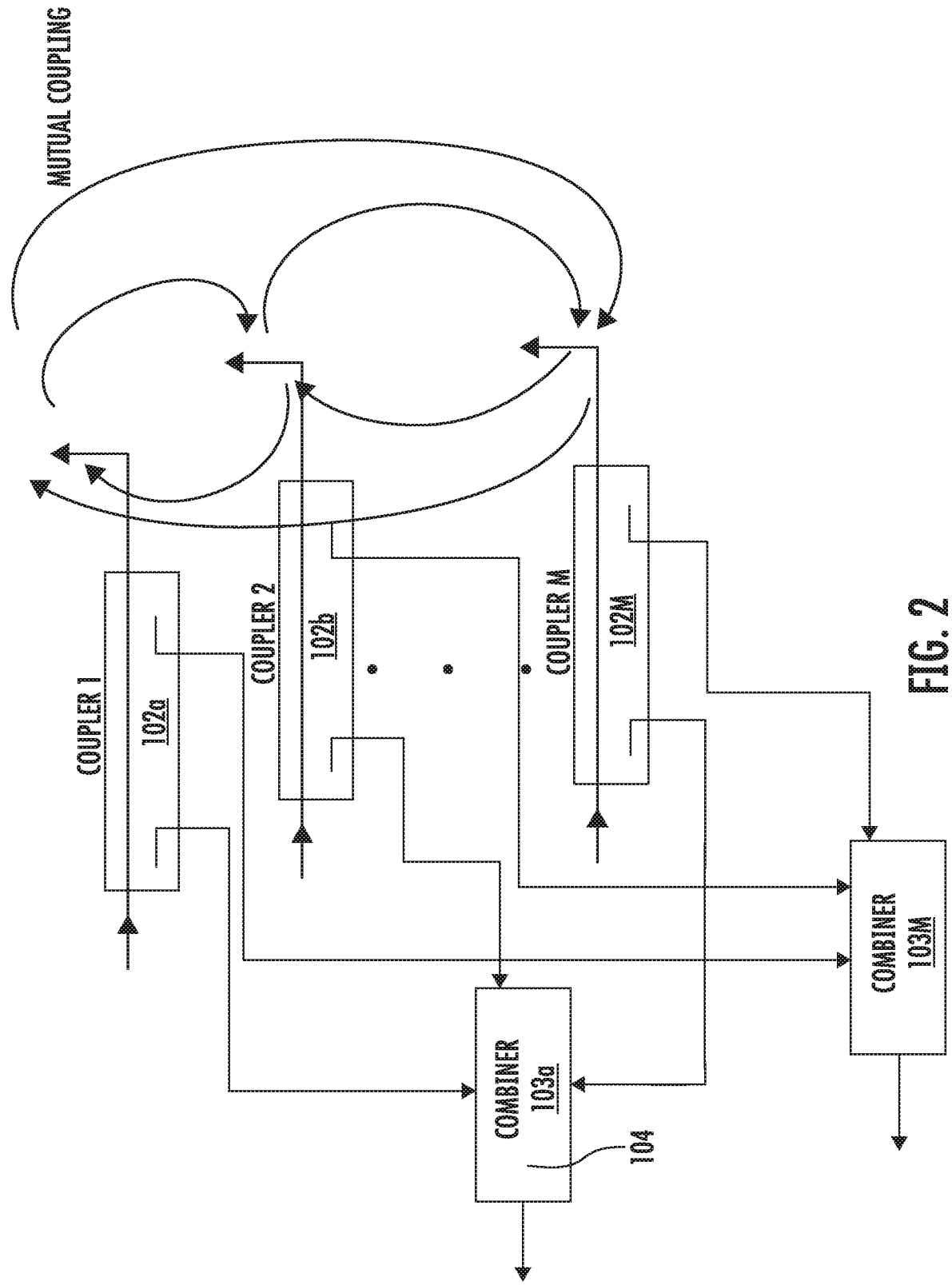
FIG. 2 depicts an antenna array comprised of M branches that are connected to M bi-directional couplers.

Before describing in detail exemplary embodiments, it is noted that the embodiments reside primarily in combinations of apparatus components and processing steps related to facilitating voltage standing wave ratio (VSWR) measurements in advanced antenna systems (AAS) in the presence of mutual coupling. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Figure 3:
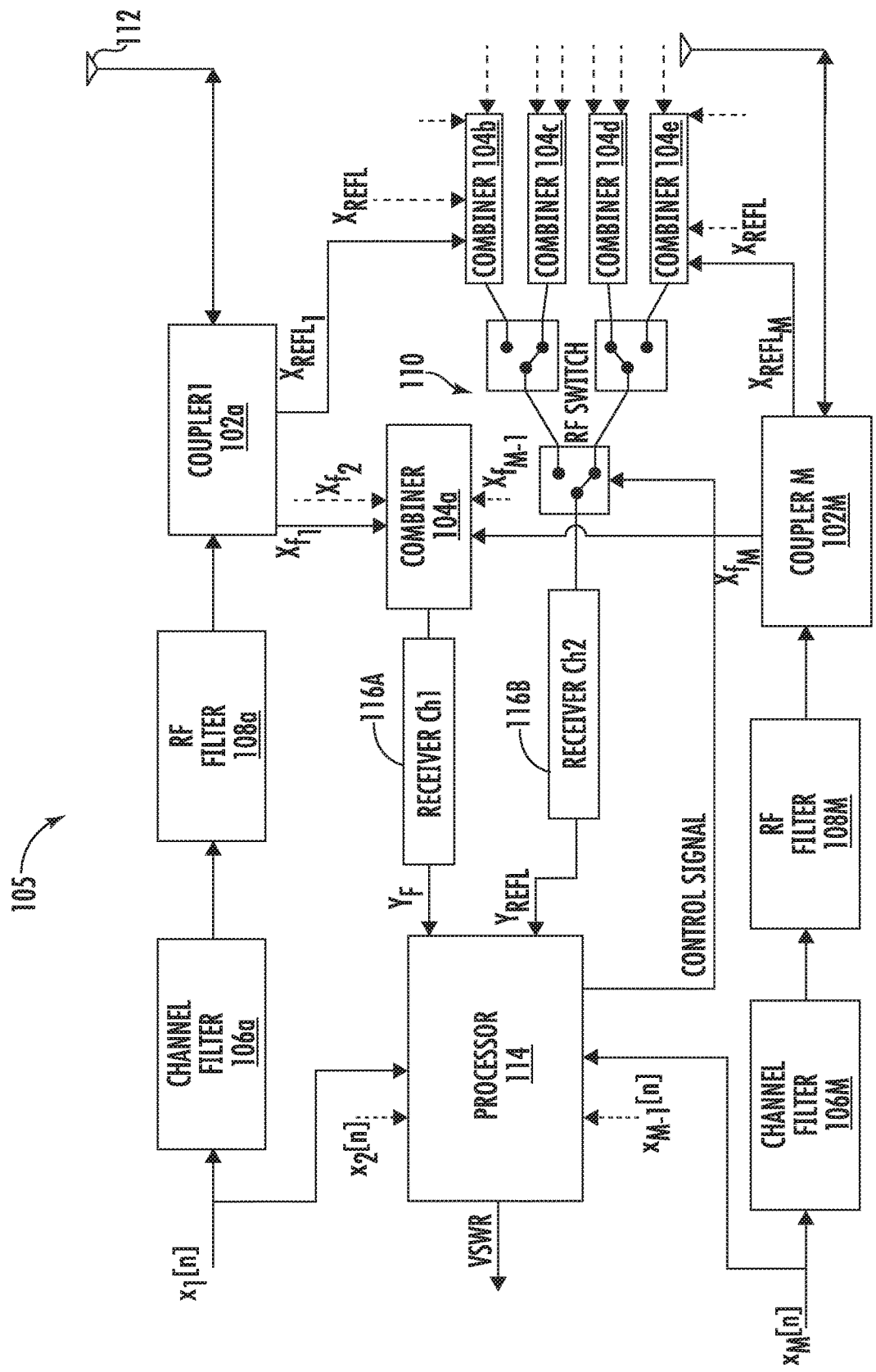
FIG. 3 is a block diagram of an example RF front end of a transceiver implemented in a base station or a wireless device.

Referring now to the drawing figures in which like reference designators refer to like elements, there is shown in FIG. 3 a block diagram of a transmitter 105 of a transceiver implemented in a base station or a wireless device constructed in accordance with the principles of the present disclosure. Shown are M paths coupling signals $x_1[n]$ to $x_M[n]$ to antenna ports $P_1$ to $P_M$, respectively. Each path has a channel filter 106m (two of which are shown in FIG. 3 as channel filters 106a and 106M), an RF filter 108m (two of which are shown in FIG. 3 as RF filters 108a and 108M) and a coupler 102m (two of which are shown in FIG. 3 as couplers 102a and 102M), referred to herein collectively as channel filters 106, RF filters 108, and couplers 102, respectively, where m=1,2, . . . M. The forward signals $X_f$ from a coupler 102 port 3 are coupled to a combiner 104a to be combined. The reflected signals $X_{refl}$ from couplers 102 port 4 are coupled to combiners 104b, 104c, 104d and 104e, and combined through RF switch 110. As will be discussed further below, the RF switch 110 couples power reflected from different groups of the antennas 112, the RF switch 110 being under control of a control signal from a processor 114 such as a digital signal processor (DSP). In some embodiments, the processor 114 may be implemented as a CPU with a memory containing programmatic software code that is executable by the CPU to perform the functions described herein. In other embodiments the processor 114 may be implemented as a field programmable gate array (FPGA), or other programmable logic device (PLD), etc. The signals $X_f$ combined by the combiner 104a are coupled to a first channel receiver 116A to produce the signal $Y_f$ which is input to the processor 114. The signals $X_{refl}$ combined by the combiners 104b-104e to a second channel receiver 116B to produce the signal $Y_{refl}$ which is input to the processor 114. The processor 114 receives the signals $Y_f$ and $Y_{refl}$ and processes the signals to produce a VSWR for each group of the antennas 112.

The power of the forward signal $X_f$ may be high compared to the reflected signal $X_{refl}$, so that the impact on the coupled signals leaking into port 3 is relatively small. Further, in some embodiments, utilization of the RF switch 110 reduces the complexity of the hardware of the transceiver as compared with known solutions.

When the transmitted signals $x_m[n]$ have low cross-correlation, which may be the case when they are orthogonal in time, frequency or code, the following steps for VSWR measurements set forth below may be implemented. The proposed method may rely on cross correlation of the signals $x_m$ with the signals $Y_f$ and with the signals $Y_{refl}$ to produce resultant vectors containing the estimated forward and reflected powers for each of the groups of the antennas.

Because the method and arrangements described herein may rely on cross correlating reference signals with combined signals that encounter unknown delays due to propagation through the transmitter all the way to the receiver, delay estimation and compensation may be applied before estimating the VSWR. Using cross correlation is one method to separate the signals. However, other methods can be used to separate the signals. To this end, using Zadoff-Chu sequences and cross correlation to generate and separate orthogonal signals is but one example of signal separation, which can be generalized to other methods.

The sum of the reference signals $x_1$ to $x_M$ and sampled forward signal $Y_f$ can be used to estimate the forward path delay Estimated_lag_f. The sum of the of reference signals that correspond to antennas in the current group and sampled forward signal $Y_f$ can be used to estimate the forward path delay Estimated_lag_r. The estimation can be performed with standard delay estimation processing such as a cross correlation in time or frequency domain.

Estimated_lag_f and Estimated_lag_r are the delays that are then applied to collected forward and reflected signals according to $$Y_{f_{aligned}} = Y_f(1, \text{Estimated\_lag}+1 : N+\text{Estimated\_lag}\_f)$$

$$Y_{REFL_{aligned}} = Y_{REFL}(1, \text{Estimated\_lag}+1 : N+\text{Estimated\_lag}\_r)$$

Once the signals are aligned, the steps for estimating the VSWR can be performed. The Estimated_lag_f is an index to read the samples of the vector $Y_f$ so as to align the forward and reference signals, and is an estimate of the delay difference between the forward and reference signals. The Estimated_lag_r is an index to read the samples of the vector $Y_{REFL}$ so as to align the reverse and reference signals, and is an estimate of the delay difference between the reverse and reference signals.

Figure 4:
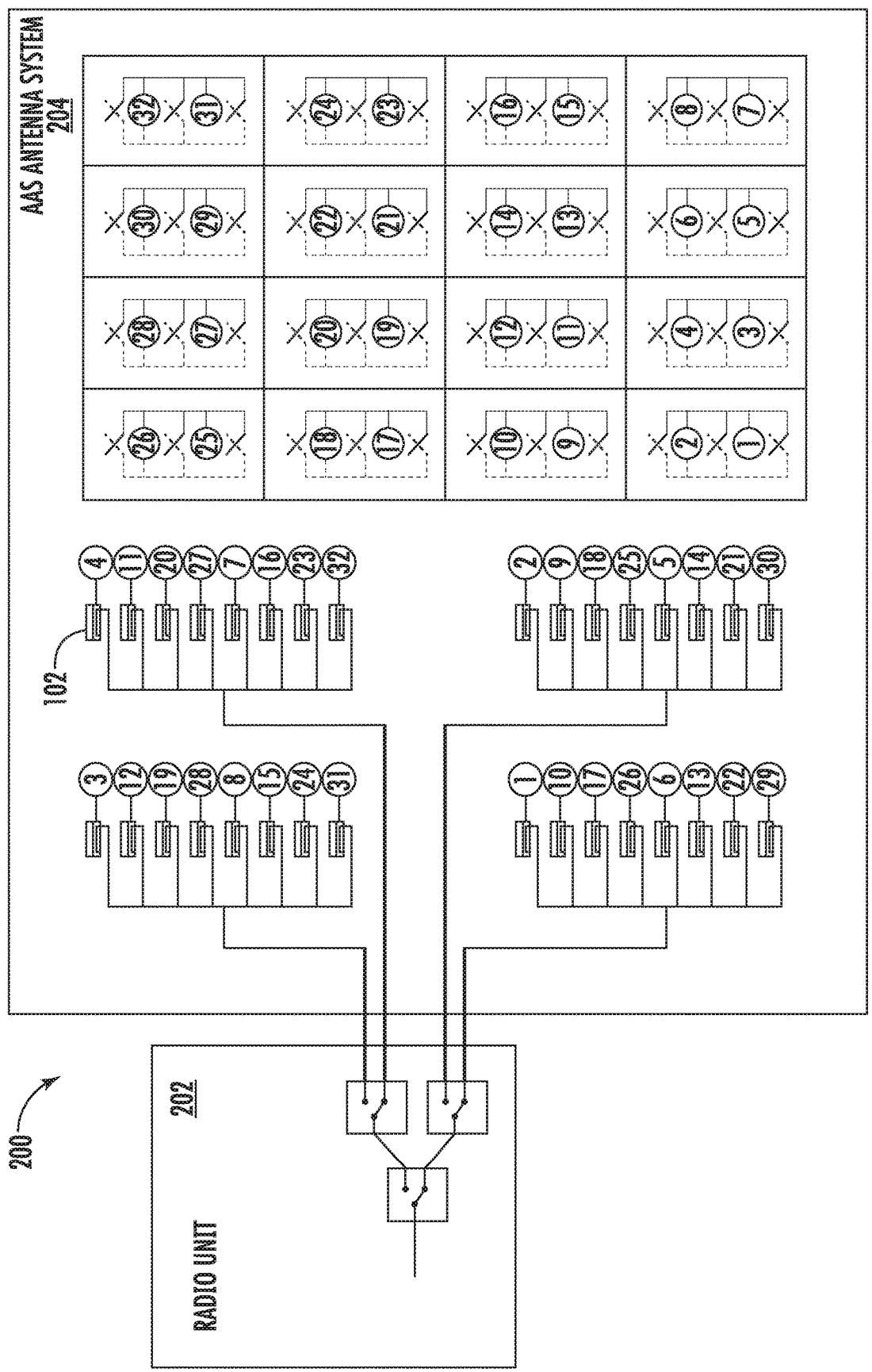
FIG. 4 shows an example of a grouping of antenna subarrays resulting in 4 reverse path connections.

For an advance antenna system (AAS), the number of antennas can be large. For example, systems having 32, 64 and 128 sub arrays have been or are being developed. According to some aspects, antennas are grouped in such a way as to reduce the adverse effects of mutual coupling. FIG. 4 shows an example of an antenna with 32 subarrays arranged in 4 columns and 4 rows, where the numbers in the circles are subarray ID numbers. In this example, each subarray has three elements and is dual polarized. The mutual coupling factor is the amount of signal coupled over the air from one antenna sub-array to all other antenna sub-arrays. Since a combiner network is used to collect the reflected signals, the leakage to the reverse path due to the mutual coupling factor could be significantly magnified due to the large number of antennas used in the AAS. For the 32 subarray antenna of FIG. 4, the mutual coupling effect from 31 paths could be added up together, and this may cause large error in the measurement of the VSWR. Also, it is not desirable to add switches inside the antenna system due to passive interference modulation PIM and the additional requirement of power supply and control interfaces. The switches could be positioned inside the radio unit 202, but for 32 subarrays, this may require 32 connectors on both the radio unit 202 and the antenna system 204. There is typically not enough space for so many connectors.

To overcome these issues, the antenna subarrays may be grouped in such a way as to use far fewer reverse path connections. For example, as shown in FIG. 4, the grouping of the antenna subarrays results in only 4 reverse path connections, while reducing the effects of mutual coupling, resulting in improved VSWR measurement accuracy. In FIG. 4, the antennas are grouped such that no adjacent antennas are in the same group and a subarray in a group having one polarization is paired with a subarray in the group having a different polarization. In this embodiment, three 2-to-1 switches are used to combine the signals from the four groups. In an alternative embodiment, a single 4-to-1 switch can be used for this purpose.

Figure 5:
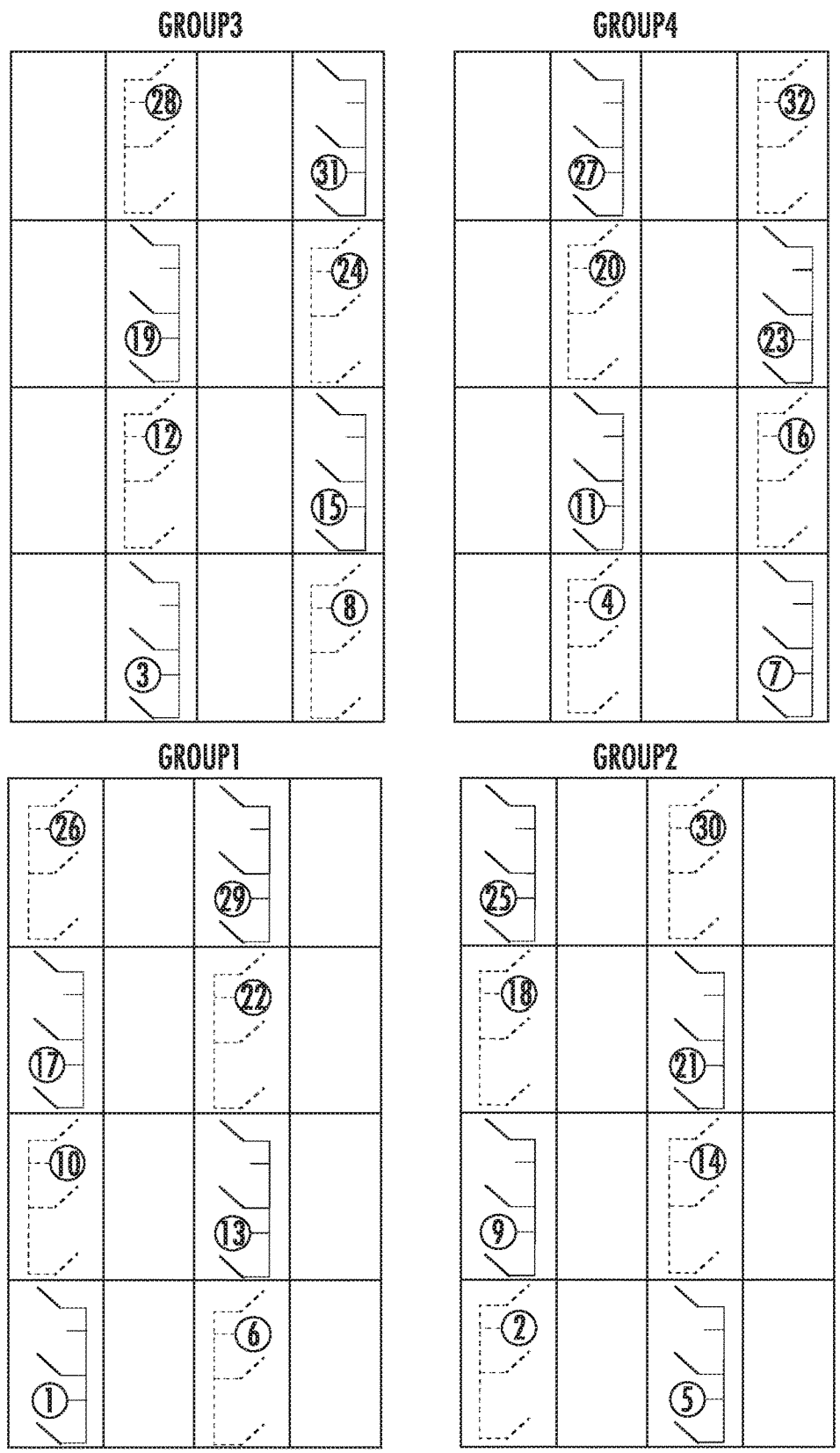
FIG. 5 shows the subarray combining pattern of the embodiment of FIG. 4.

FIG. 5 shows the subarray combining pattern of the embodiment of FIG. 4, where the circled numbers in FIG. 5 correspond to the circled subarray ID numbers in FIG. 4. Since the highest mutual coupling occurs for adjacent subarrays, no adjacent subarrays are in the same group, to avoid the highest mutual coupling. Also, since polarization isolation also reduces the error in VSWR measurement, the pairing of subarrays within a group are of opposite polarization. Thus, for example, subarray 1 is not adjacent to subarray 6, with which it is grouped, but has the opposite polarization of subarray 6. Further note that with smaller numbers of subarrays in a group, smaller error in VSWR measurements can be achieved.

A process for facilitating VSWR measurements in an AAS is further explained as follows. The transmitted orthogonal signals may be expressed in matrix form as follows:

$$X = \begin{bmatrix} x_1[1] & \cdots & x_1[N] \\ \vdots & \ddots & \vdots \\ x_M[1] & \cdots & x_M[N] \end{bmatrix}$$

where N is the total number of samples and M is the number of channels. The value of N may depend on the bandwidth for the signal and the sampling frequency.

The forward coupled signal at port 3 of the coupler (after delay estimation and compensation performed in steps 1 and 2) may be defined as $$X_{f_i}[n] = S_{31}x_i[n]*h[n] + S_{32}\Gamma_i x_i[n]*h[n]$$

where i=1: M is the branch index, $h[n]=h_{ch}[n]*h_{RF}[n]$ is the combined transfer function for the channel filter 106 and the RF filter 108. Other impairments can also be added in the same way. $S_{31}$ is the forward coupling factor, $S_{32}$ is the isolation, which is the product of the directivity and coupling, and $\Gamma_i$ is the reflection coefficient of branch i. The first term in this equation is the forward coupled signal and the second term is the reflected leaked signal.

The reflected coupled signal at port 4 may be defined as:

$$X_{REFL_i}[n] = S_{41}x_i[n]*h[n] + S_{42}\Gamma_i x_i[n]*h[n]$$

where $S_{41}$ is forward the isolation and $S_{42}$ is the reverse coupling. The second term in this equation is the coupled reflected signal and the first term is leaked signal from port 1 to port 4. Assuming no mutual coupling, the forward signal received by receiver channel 1 may then be described as $$Y_{FWD}[n] = \sum_{i=1}^{M} X_{f_i}[n] + w_{FWD}[n] \qquad (1)$$

where $w_{FWD}$ is the noise added after combing all M forward signals $x_{f_i}$ at receiver 1. The reflected signal received by receiver channel 2 may also be described as $$Y_{REFL}[n] = \sum_{i=1}^{M} X_{REFL_i}[n] + w_{REFL}[n] \qquad (2)$$

where $w_{REFL}$ is the noise added after combining all M reflected signals $x_{REFL_i}$. Each of these two vectors has dimensions 1×N.

The two received signals $Y_{FWD}$ and $Y_{REFL}$ are then input to the DSP unit for further processing.

To separate the orthogonal signals powers, two cross correlation operations may then be applied to $Y_{FWD}$ and $Y_{REFL}$ according to $$\hat{P}_{FWD} = Y_F * \text{ctranspose}(X)$$

$$\hat{P}_{REFL} = Y_{REFL} * \text{ctranspose}(X)$$

where ctranspose is the complex transpose of matrix $X_f$. The resulting vectors from the above two equations contain the estimated forward and reflected powers across M branches. Let $$\hat{P}_{FWD} = [\hat{P}_{1\_FWD}, \hat{P}_{2\_FWD}, \ldots, \hat{P}_{M\_FWD}]$$

where $\hat{P}_{1\_FWD}$ is the estimated forward power from branch 1, which can be written as $$\hat{P}_{1\_FWD} = \frac{1}{N}\sum_{n=1}^{N}\left(\sum_{i=1}^{M} X_{f_i}[n] + w_{FWD}[n]\right)x_1^*[n]$$

$$\hat{P}_{1\_FWD} = \frac{1}{N}\sum_{n=1}^{N}\left(\left(\sum_{i=1}^{M} X_{f_i}[n]\right)x_1^*[n] + w_{FWD}[n]x_1^*[n]\right)$$

$$\hat{P}_{1\_FWD} = \frac{1}{N}\sum_{n=1}^{N}\left(\sum_{i=1}^{M} X_{f_i}[n]\right)x_1^*[n] + \frac{1}{N}\sum_{n=1}^{N} w_{FWD}[n]x_1^*[n]$$

Let $$Z_{1_{FWD}} = \frac{1}{N}\sum_{n=1}^{N} w_{FWD}[n]x_1^*[n]$$

Hence $$\hat{P}_{1\_FWD} = \frac{1}{N}\sum_{n=1}^{N}\left(\sum_{i=1}^{M} X_{f_i}[n]\right)x_1^*[n] + Z_{1_{FWD}}$$

which yields:

$$\frac{1}{N}\sum_{n=1}^{N}\left(\sum_{i=1}^{M} X_{f_i}[n]\right)x_1^*[n] = \frac{1}{N}\sum_{n=1}^{N} X_{f_1}[n]x_1^*[n] + \frac{1}{N}\sum_{n=1}^{N}\left(\sum_{i=2}^{M} X_{f_i}[n]\right)x_1^*[n]$$

Because the signals are orthogonal, the first term on the right-hand side of the equal sign is zero:

$$\frac{1}{N}\sum_{n=1}^{N}\left(\sum_{i=2}^{M} X_{f_i}[n]\right)x_1^*[n] = 0$$

Note that h[n] does not impact the orthogonality of the signals. Let $$P_{1_{FWD}} = \frac{1}{N}\sum_{n=1}^{N} x_{f_1}[n]x_1^*[n]$$

Then:

$$\hat{P}_{1\_FWD} = P_{1_{FWD}} + Z_{1_{FWD}}$$

For the reflected path:

$$\hat{P}_{1\_REFL} = P_{1_{REFL}} + Z_{1_{REFL}}$$

The estimated reflection coefficient for all branches may then be estimated as:

$$\hat{\Gamma} = \frac{abs(\hat{P}_{REFL})}{abs(\hat{P}_{FWD})}$$

which can be approximated as:

$$\hat{\Gamma} = \frac{S_{41} + S_{42}\Gamma}{S_{31} + S_{32}\Gamma}$$

Hence, when forward and reverse coupling are equal, i.e., $S_{31}=S_{42}$ and under no leakage due to directivity, i.e., $S_{41}=S_{32}=0$, the measured reflection coefficient $\hat{\Gamma}=\Gamma$, and the estimated return loss in dB is:

$$\widehat{RL}_{dB} = 20\log_{10}|\hat{\Gamma}|$$

Then, the VSWR vector for all branches is $$VSWR = \frac{1+|\hat{\Gamma}|}{1-|\hat{\Gamma}|}$$

which is the ideal case when there is no mutual coupling.

When there is mutual coupling, the transmitted signal is leaked to all other antenna element branches. In the following, branch 1 is used as an example. Define the transmitted signal from branch 1, $x_{t_1}$:

$$x_{t_1}[n] = x_1[n](1-\Gamma_1)$$

This transmitted signal is then received by all other M−1 branches. The received signal at any of the branches is defined as $$x_{R_i}[n] = x_1[n](1-\Gamma_1)(1+\Gamma_i)C_i \quad (3)$$

where $C_i$ is the mutual coupling value between branch 1 and branch i and $\Gamma_i$ is the reflection coefficient at branch i. For simplicity, assume that the S-parameters of all couplers are identical. The forward signal from branch 1 after adding the mutual coupling after the combiner is now $$X_{F1_{MC}}[n] = X_{f_i}[n] + S_{32}\sum_{i=2}^{M} x_{R_i}[n]$$

$$X_{F1_{MC}}[n] = X_{f_i}[n] + S_{32}x_1[n]*h[n](1-\Gamma_1)\sum_{i=2}^{M}(1+\Gamma_i)C_i$$

The reflected signal from branch 1 after adding the mutual coupling after the combiner is now $$X_{REFL1_{MC}}[n] = X_{f_i}[n] + S_{42}\sum_{i=2}^{M} x_{R_i}[n]$$

$$X_{REFL1_{MC}}[n] = X_{REFL_i}[n] + S_{42}x_1[n]*h[n](1-\Gamma_1)\sum_{i=2}^{M}(1+\Gamma_i)C_i$$

Hence, the measured reflection coefficient after applying the cross correlation and taking the ratio is now $$\widehat{\Gamma_{MC}} = \frac{S_{41} + S_{42}\Gamma_i + S_{42}(1-\Gamma_1)\sum_{i=2}^{M}(1+\Gamma_i)C_i}{S_{31} + S_{32}\Gamma_i + S_{32}(1-\Gamma_1)\sum_{i=2}^{M}(1+\Gamma_i)C_i}$$

As can be seen from this last equation, due to mutual coupling, much higher error on the estimated reflection coefficient is expected. Hence, an objective of using an RF switch is to minimize the third term in the numerator because, the third term in the numerator has much lower impact on the forward signal, i.e., the denominator. The third term in the numerator is reduced by grouping the subarrays. For the example 32 subarray AAS of FIGS. 4 and 5, the coupling coefficients $C_i$ may be reduced by choosing only non-adjacent subarrays in the group. This reduces the third term in the numerator of $\widehat{\Gamma_{MC}}$. Having only a relatively small number of subarrays in a group reduces M, resulting in further reduction of the third term in the numerator of $\widehat{\Gamma_{MC}}$. Also, having the antenna subarrays grouped such that subarrays in the group that are in the same row are of different polarization, the isolation term $S_{32}$ is reduced, further reducing the third term in the denominator. This reduction of the third term in the numerator and the third term in the denominator increases the accuracy of the VSWR computed from $\widehat{\Gamma_{MC}}$.

Figure 6:
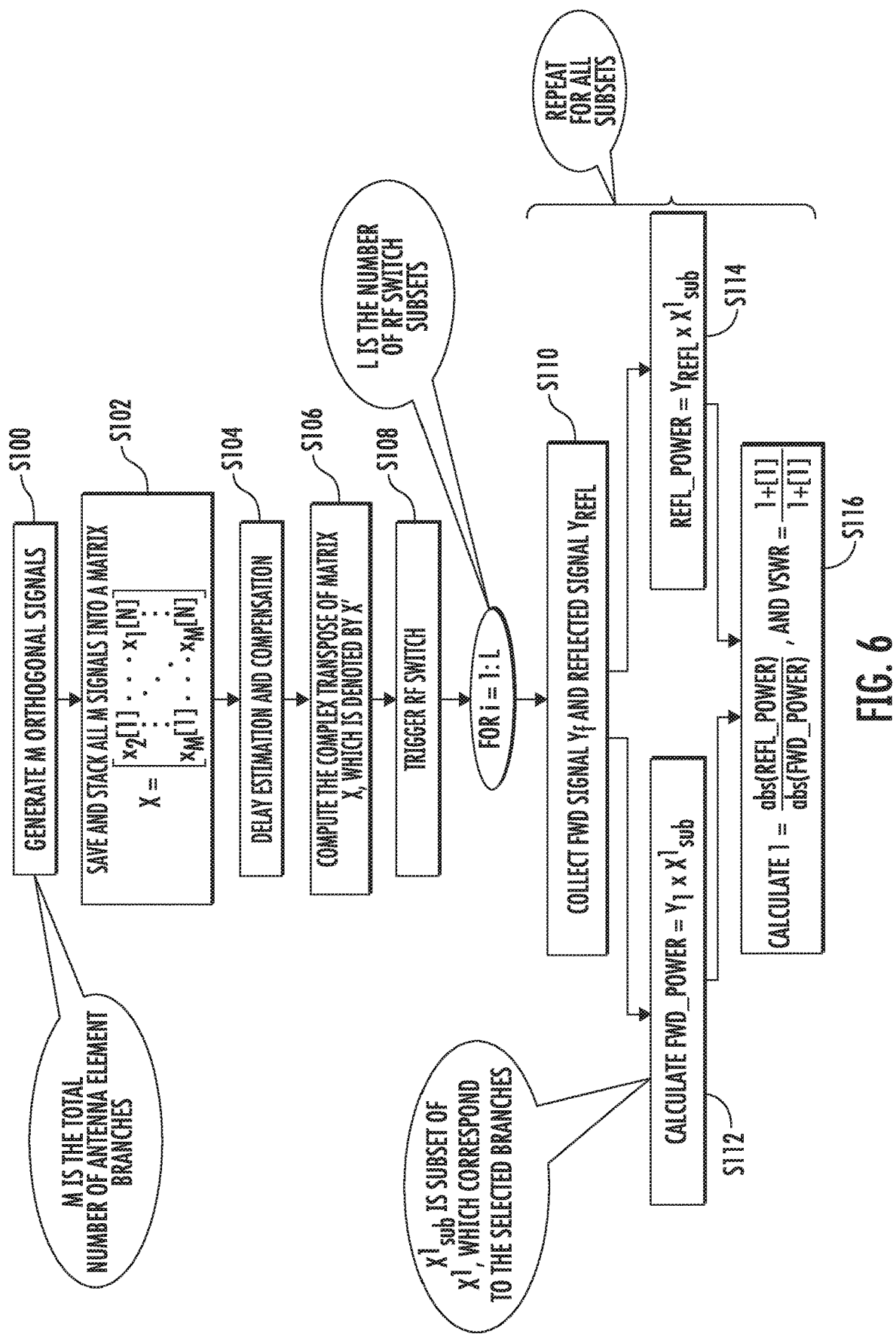
FIG. 6 is a flowchart of an example process for determining VSWR of an antenna array having multiple subarrays.

FIG. 6 is a flowchart of an exemplary process for determining VSWR of an antenna array having multiple subarrays. The process includes generating M orthogonal signals (block S100), where M is the total number of antenna element branches. The M signals are stored and may be accessed by matrix indices (block S102). Delay estimation and compensation are performed (block S104). The complex transpose of the matrix stored at block S102 is computed (block S106). The process includes triggering an RF switch (block S108). Then, for each of L number of switch subsets, the steps set forth in blocks S110-S116 are performed. At block S110, forward signals $Y_f$ and reflected signals $Y_r$ are collected. At block S112, the forward power is calculated and at block S114 the reflected power is calculated. At block S116, the reflection coefficient and VSWR are computed, such as according to the formulas explained above.

Figure 7:
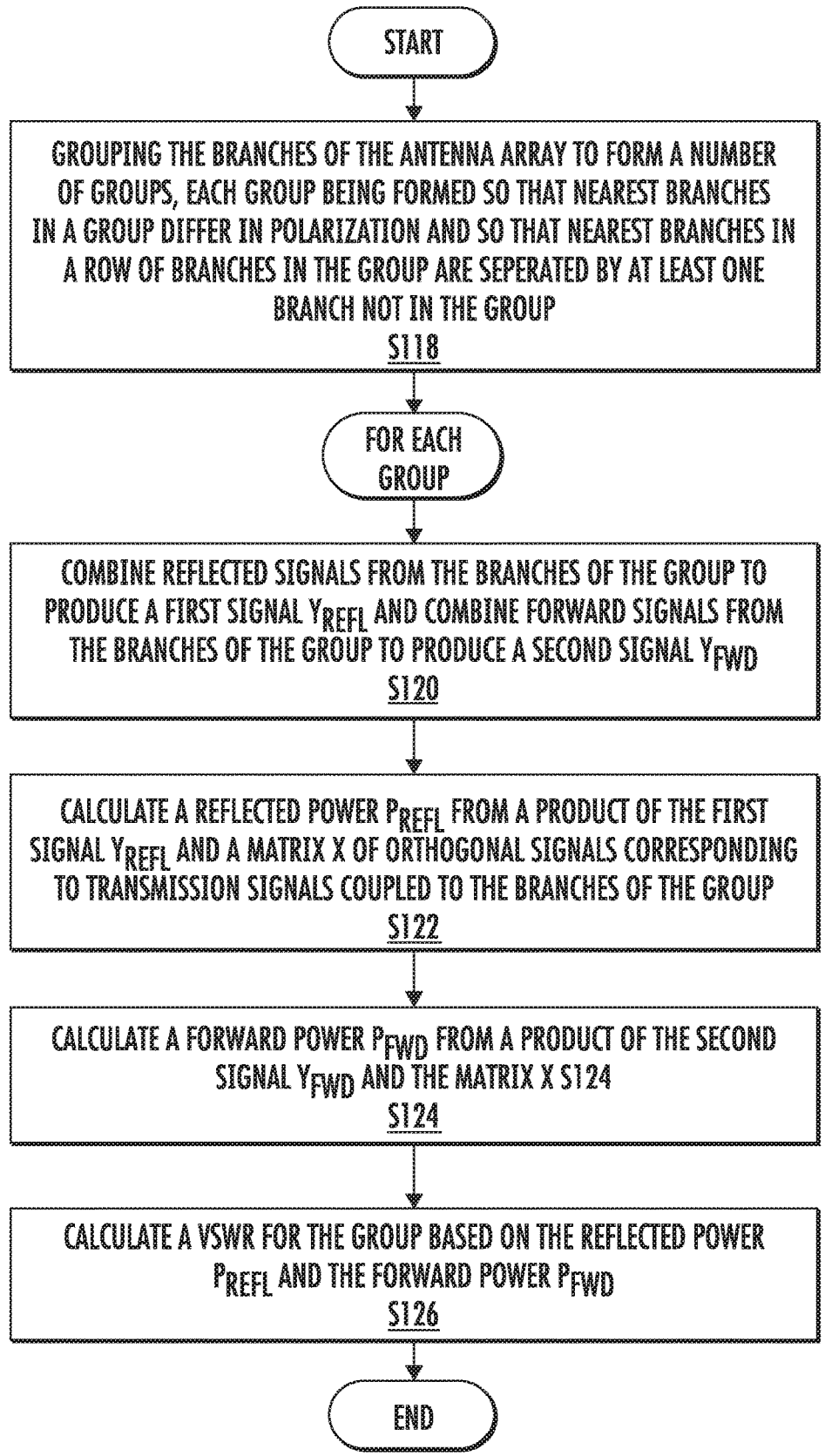
FIG. 7 is a flowchart of an example process for determining a VSWR of an antenna array having dual polarized antenna elements.

FIG. 7 is a flowchart of an exemplary process for determining a VSWR of an antenna array having dual polarized antenna elements. The process includes grouping, via wiring including RF switches 110, the branches of the antenna array to form a number of groups, each group being formed so that nearest branches in a group differ in polarization and so that nearest branches in a row of branches in the group are separated by at least one branch not in the group (block S118). Then, for each group, the process includes combining, via the combiners 104*b*-104*e*, reflected signals from the branches of the group to produce a first signal $Y_{REFL}$ and combining, via the combiner 104*a*) forward signals from the branches of the group to produce a second signal $Y_{FWD}$ (block S120). For each group the process also includes calculating, via the processor 114, a reflected power $P_{REFL}$ from a product of the first signal $Y_{REFL}$ and a matrix X of orthogonal signals corresponding to transmission signals coupled to the branches of the group (block S122). The process further includes, for each group, calculating, via the processor 114, a forward power $P_{FWD}$ from a product of the second signal $Y_{FWD}$ and the matrix X (block S124). Finally, for each group the process includes calculating, via the processor 114, a VSWR for the group based on the reflected power $P_{REFL}$ and the forward power $P_{FWD}$ (block S126).

Figure 8:
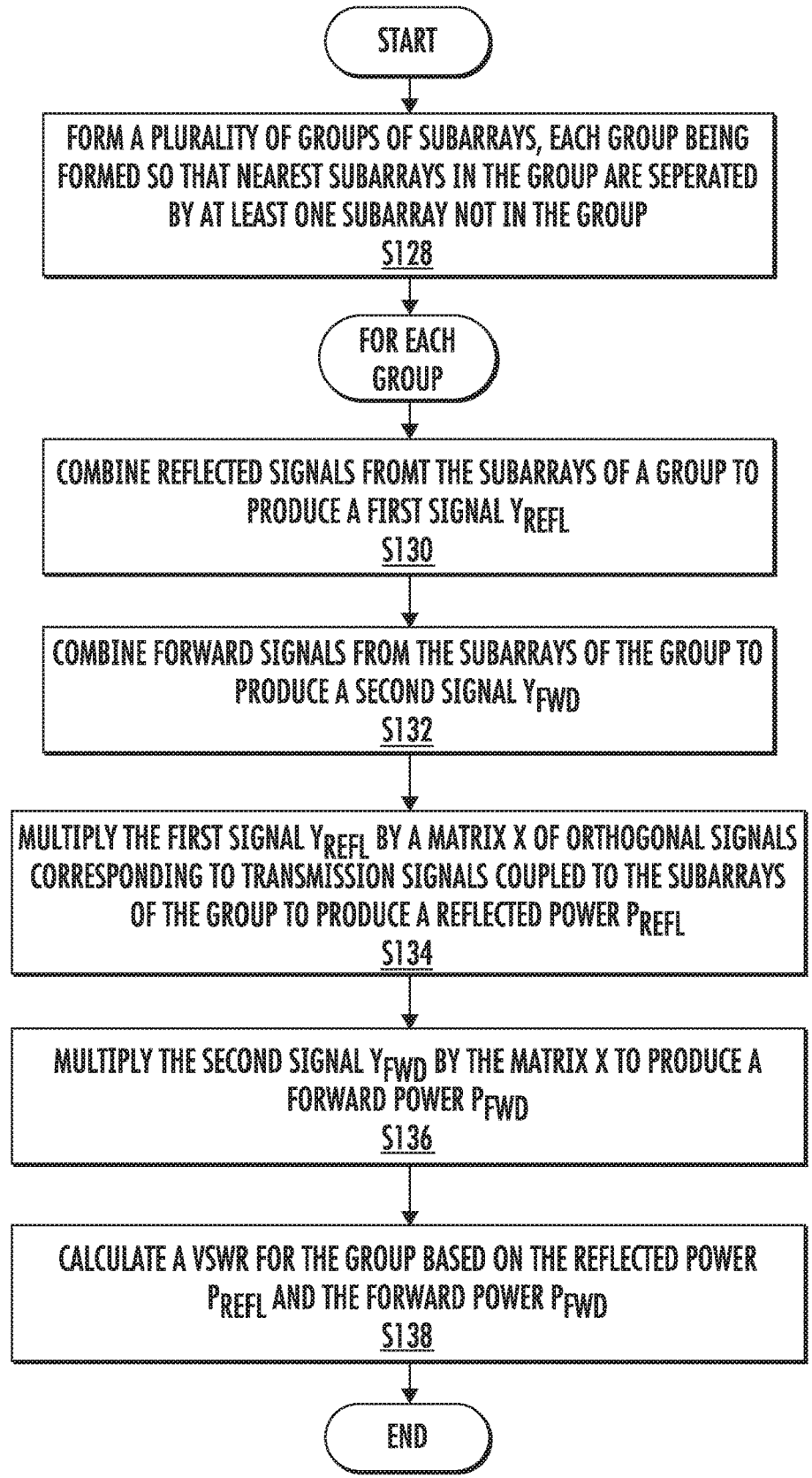
FIG. 8 is a flowchart of an example process for determining a VSWR of an antenna array having single polarized antenna elements.

FIG. 8 is a flowchart of an exemplary process for determining a VSWR of an antenna array having single polarized antenna elements. The process includes forming, via wiring including RF switches 110, a plurality of groups of subarrays, where each group is formed so that nearest subarrays in the group are separated by at least one subarray not in the group (block S128). Then, for each group, the process includes: combining, via the combiners 104b-104e, reflected signals from the subarrays of a group to produce a first signal $Y_{REFL}$ (block S130) and combining, via the combiner 104a, forward signals from the subarrays of the group to produce a second signal $Y_{FWD}$ (block S132). Also, for each group, the process includes multiplying, via the processor 114, the first signal $Y_{REFL}$ by a matrix X of orthogonal signals corresponding to transmission signals coupled to the subarrays of the group to produce a reflected power $P_{REFL}$ (block S134), multiplying, via the processor 114, the second signal $Y_{FWD}$ by the matrix X to produce a forward power $P_{FWD}$ (block S136) and calculating, via the processor 114, a VSWR for the group based on the reflected power $P_{REFL}$ and the forward power $P_{FWD}$ (block S138).

Thus, some embodiments provide for VSWR measurements in an advanced antenna array system (AAS) in the presence of strong mutual coupling between subarrays. The VSWR measurement resulting from the configurations described herein, is improved as compared to known techniques. Some advantages include, but are not limited to:

1. The ability to measure VSWR without direct access to the coupler's forward and reflected ports.

2. By combining the subarrays into groups and utilizing the combined forward and reflected signals to calculate a reflection coefficient for each group, a more accurate determination of the VSWR, as compared with known techniques, is achieved.

3. A more accurate VSWR, as compared with known techniques, can be achieved with relatively small computational power and memory use. In summary, by selective grouping of subarrays such that the selected branches are separated in distance and polarization, mutual coupling is reduced, as compared to prior configurations, thereby minimizing the impact of mutual coupling on VSWR determination.

According to one aspect, a method of determining voltage standing wave ratios, VSWR, of an antenna array 204 having multiple subarrays is provided. Each subarray has two branches, each of the two branches has different polarizations so that a subarray is dual-polarized. The method includes grouping the branches of the antenna array 204 to form a number of groups, each group being formed so that nearest branches in a group differ in polarization and so that nearest branches in a row of branches in the group are separated by at least one branch not in the group (block S118). The method includes for each group: combining reflected signals from the branches of the group to produce a first signal $Y_{REFL}$ and combining forward signals from the branches of the group to produce a second signal $Y_{FWD}$ (block S120); calculating a reflected power $P_{REFL}$ from a product of the first signal $Y_{REFL}$ and a matrix X of orthogonal signals corresponding to transmission signals coupled to the branches of the group (block S122); calculating a forward power $P_{FWD}$ from a product of the second signal $Y_{FWD}$ and the matrix X (block S124); and calculating a VSWR for the group based on the reflected power $P_{REFL}$ and the forward power $P_{FWD}$ (block S126).

According to this aspect, in some embodiments, nearest branches of a group within a row are separated by one subarray in the row. In some embodiments, the reflected signals are each from a port of a coupler 102 connected to a branch of the group. In some embodiments, a port of each coupler 102 connected to a branch of the group provides a forward signal. In some embodiments, the VSWR is computed based on ratio of a magnitude of $P_{REFL}$ to a magnitude of $P_{FWD}$. In some embodiments, a return loss is computed based on a difference between $P_{REFL}$ expressed in dB and $P_{FWD}$ expressed in dB. In some embodiments, the combining is performed by at least one RF switch 110 in a radio unit connected to the antenna array. In some embodiments, the number of RF switches 110 is equal to the number of groups minus one. In some embodiments, a group is selectable by at least one RF switch 110 controllable by a processor of a radio unit connected to the antenna array 204. In some embodiments, the number of groups is equal to a total number of subarrays of the antenna array 204 divided by a power of two. In some embodiments, the method further includes, for each group, performing delay estimation and compensation for the combined reflected signals and for the combined forward signals.

According to another aspect, a transmitter 105 configured to determine voltage standing wave ratios, VSWR, of an antenna array 204 having multiple subarrays, each subarray having two branches, each of the two branches having different polarizations so that a subarray is dual-polarized is provided. The transmitter 105 includes, for each group of a plurality of branches of the antenna array 204, a plurality of couplers 102, each coupler 102 connected to a branch in a group, each group being formed so that nearest branches in a group differ in polarization and so that nearest branches in a row of branches in the group are separated by at least one branch not in the group. The transmitter 105 further includes a first set of combiners 104b-104e configured to combine reflected signals from first ports of the couplers of a group to produce a first signal $Y_{REFL}$. The transmitter 105 further includes a second combiner 104a configured to combine forward signals from second ports of the couplers 102 of the group to produce a second signal $Y_{FWD}$. The transmitter 105 also includes a processor 114 configured to: calculate a reflected power $P_{REFL}$ from a product of the first signal $Y_{REFL}$ and a matrix X of orthogonal signals corresponding to transmission signals coupled to the branches of the group; calculate a forward power $P_{FWD}$ from a product of the second signal $Y_{FWD}$ and the matrix X; and calculate a VSWR for the group based on the reflected power $P_{REFL}$ and the forward power $P_{FWD}$.

According to this aspect, in some embodiments, nearest branches of a group within a row are separated by one subarray in the row. In some embodiments, the reflected signals are each from a port of a coupler 102 connected to a branch of the group. In some embodiments, a port of each coupler 102 connected to a branch of the group provides a forward signal. In some embodiments, the VSWR is computed based on ratio of a magnitude of $P_{REFL}$ to a magnitude of $P_{FWD}$. In some embodiments, a return loss is computed based on a difference between $P_{REFL}$ expressed in dB and $P_{FWD}$ expressed in dB. In some embodiments, the combining is performed by at least one RF switch 110 in a radio unit connected to the antenna array 204. In some embodiments, the number of RF switches 110 is equal to the number of groups minus one. In some embodiments, a group is selectable by at least one switch 100 controllable by a processor 114 of a radio unit connected to the antenna array. In some embodiments, the number of groups is equal to a total number of subarrays of the antenna array 204 divided by a power of two. In some embodiments, the processor 114 is further configured to, for each group, perform delay estimation and compensation for the combined reflected signals and for the combined forward signals.

According to yet another aspect, a method of determining voltage standing wave ratios, VSWR, of an antenna array 204 having a plurality of single-polarized subarrays is provided. The method includes forming a plurality of groups of subarrays, each group being formed so that nearest subarrays in the group are separated by at least one subarray not in the group (block 128). For each group, the method includes combining reflected signals from the subarrays of a group to produce a first signal $Y_{REFL}$ (block S130); combining forward signals from the subarrays of the group to produce a second signal $Y_{FWD}$ (block S132); multiplying the first signal $Y_{REFL}$ by a matrix X of orthogonal signals corresponding to transmission signals coupled to the subarrays of the group to produce a reflected power $P_{REFL}$ (block S134); multiplying the second signal $Y_{FWD}$ by the matrix X to produce a forward power $P_{FWD}$ (block S136); calculating a VSWR for the group based on the reflected power $P_{REFL}$ and the forward power $P_{FWD}$ (block S138). As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method of determining voltage standing wave ratios, VSWR, of an antenna array having multiple subarrays, each subarray having two branches, each of the two branches having different polarizations so that a subarray is dual-polarized, the method comprising:

grouping the branches of the antenna array to form a number of groups, each group being formed so that nearest branches in a group differ in polarization and so that nearest branches in a row of branches in the group are separated by at least one branch not in the group; and for each group:
combining reflected signals from the branches of the group to produce a first signal $Y_{REFL}$ and combining forward signals from the branches of the group to produce a second signal $Y_{FWD}$;
calculating a reflected power $P_{REFL}$ from a product of the first signal $Y_{REFL}$ and a matrix X of orthogonal signals corresponding to transmission signals coupled to the branches of the group;

calculating a forward power $P_{FWD}$ from a product of the second signal $Y_{FWD}$ and the matrix X; and calculating a VSWR for the group based on the reflected power $P_{REFL}$ and the forward power $P_{FWD}$.

2. The method of claim 1, wherein nearest branches of a group within a row are separated by one subarray in the row.

3. The method of claim 1, wherein the reflected signals are each from a port of a coupler connected to a branch of the group.

4. The method of claim 3, wherein a port of each coupler connected to a branch of the group provides a forward signal.

5. The method of claim 1, wherein the VSWR is computed based on ratio of a magnitude of $P_{REFL}$ to a magnitude of $P_{FWD}$.

6. The method of claim 1, wherein a return loss is computed based on a difference between $P_{REFL}$ expressed in dB and $P_{FWD}$ expressed in dB.

7. The method of claim 1, wherein the combining is performed by at least one switch in a radio unit connected to the antenna array.

8. The method of claim 7, wherein the number of switches is equal to the number of groups minus one.

9. The method of claim 1, wherein a group is selectable by at least one switch controllable by a processor of a radio unit connected to the antenna array.

10. The method of claim 1, wherein the number of groups is equal to a total number of subarrays of the antenna array divided by a power of two.

11. The method of claim 1, further comprising, for each group, performing delay estimation and compensation for the combined reflected signals and for the combined forward signals.

12. A transmitter configured to determine voltage standing wave ratios, VSWR, of an antenna array having multiple subarrays, each subarray having two branches, each of the two branches having different polarizations so that a subarray is dual-polarized, the transmitter comprising:

for each group of a plurality of branches of the antenna array, a plurality of couplers, each coupler connected to a branch in a group, each group being formed so that nearest branches in a group differ in polarization and so that nearest branches in a row of branches in the group are separated by at least one branch not in the group;

a first set of combiners configured to combine reflected signals from first ports of the couplers of a group to produce a first signal $Y_{REFL}$;

a second combiner configured to combine forward signals from second ports of the couplers of the group to produce a second signal $Y_{FWD}$; and a processor configured to:

calculate a reflected power $P_{REFL}$ from a product of the first signal $Y_{REFL}$ and a matrix X of orthogonal signals corresponding to transmission signals coupled to the branches of the group;

calculate a forward power $P_{FWD}$ from a product of the second signal $Y_{FWD}$ and the matrix X; and calculate a VSWR for the group based on the reflected power $P_{REFL}$ and the forward power $P_{FWD}$.

13. The transmitter of claim 12, wherein nearest branches of a group within a row are separated by one subarray in the row.

14. The transmitter of claim 12, wherein the reflected signals are each from a port of a coupler connected to a branch of the group.

15. The transmitter of claim 14, wherein a port of each coupler connected to a branch of the group provides a forward signal.

16. The transmitter of claim 12, wherein the VSWR is computed based on ratio of a magnitude of $P_{REFL}$ to a magnitude of $P_{FWD}$.

17. The transmitter of claim 12, wherein a return loss is computed based on a difference between $P_{REFL}$ expressed in dB and $P_{FWD}$ expressed in dB.

18. The transmitter of claim 12, wherein the combining is performed by at least one switch in a radio unit connected to the antenna array.

19. The transmitter of claim 18, wherein the number of switches is equal to the number of groups minus one.

20. The transmitter of claim 12, wherein a group is selectable by at least one switch controllable by a processor of a radio unit connected to the antenna array.

21. The transmitter of claim 12, wherein the number of groups is equal to a total number of subarrays of the antenna array divided by a power of two.

22. The transmitter of claim 12, wherein the processor is further configured to, for each group, perform delay estimation and compensation for the combined reflected signals and for the combined forward signals.

23. A method of determining voltage standing wave ratios, VSWR, of an antenna array having a plurality of single-polarized subarrays, the method comprising:

forming a plurality of groups of subarrays, each group being formed so that nearest subarrays in the group are separated by at least one subarray not in the group; and for each group:

combining reflected signals from the subarrays of a group to produce a first signal $Y_{REFL}$;

combining forward signals from the subarrays of the group to produce a second signal $Y_{FWD}$;

multiplying the first signal $Y_{REFL}$ by a matrix X of orthogonal signals corresponding to transmission signals coupled to the subarrays of the group to produce a reflected power $P_{REFL}$;

multiplying the second signal $Y_{FWD}$ by the matrix X to produce a forward power $P_{FWD}$;

calculating a VSWR for the group based on the reflected power $P_{REFL}$ and the forward power $P_{FWD}$.

* * * * *